(12) United States Patent
Kato et al.

(10) Patent No.: US 7,994,435 B2
(45) Date of Patent: Aug. 9, 2011

(54) ELECTROMAGNETIC-WAVE SUPPRESSING RADIATOR SHEET AND ELECTRONIC APPARATUS

(75) Inventors: Yoshihiro Kato, Kanagawa (JP);
Kazuhiko Suzuki, Kanagawa (JP);
Masaki Orihashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 266 days.

(21) Appl. No.: 12/314,044

(22) Filed: Dec. 3, 2008

(65) Prior Publication Data

US 2009/0178843 A1 Jul. 16, 2009

(30) Foreign Application Priority Data

Jan. 11, 2008 (JP) ................. 2008-004967

(51) Int. Cl.
*H05K 9/00* (2006.01)
(52) U.S. Cl. ..................... 174/391; 361/704

(58) Field of Classification Search .......... 174/377, 174/391; 361/816, 818, 704
See application file for complete search history.

(56) References Cited

U.S. PATENT DOCUMENTS

| | | | | |
|---|---|---|---|---|
| 5,990,417 | A * | 11/1999 | Senda et al. | 174/391 |
| 6,931,713 | B2 * | 8/2005 | Roshen | 29/609 |
| 2002/0162673 | A1 * | 11/2002 | Cook et al. | 174/35 MS |
| 2006/0272856 | A1 * | 12/2006 | Arnold | 174/377 |

FOREIGN PATENT DOCUMENTS

JP 2001-015656 1/2001
* cited by examiner

*Primary Examiner* — Hung V Ngo
(74) *Attorney, Agent, or Firm* — Rader, Fishman & Grauer PLLC

(57) ABSTRACT

An electromagnetic-wave suppressing radiator sheet includes a heat conductive sheet and at least one magnetic layer in the heat conductive sheet. The magnetic layer includes a plurality of plate-shaped magnetic bodies.

21 Claims, 8 Drawing Sheets

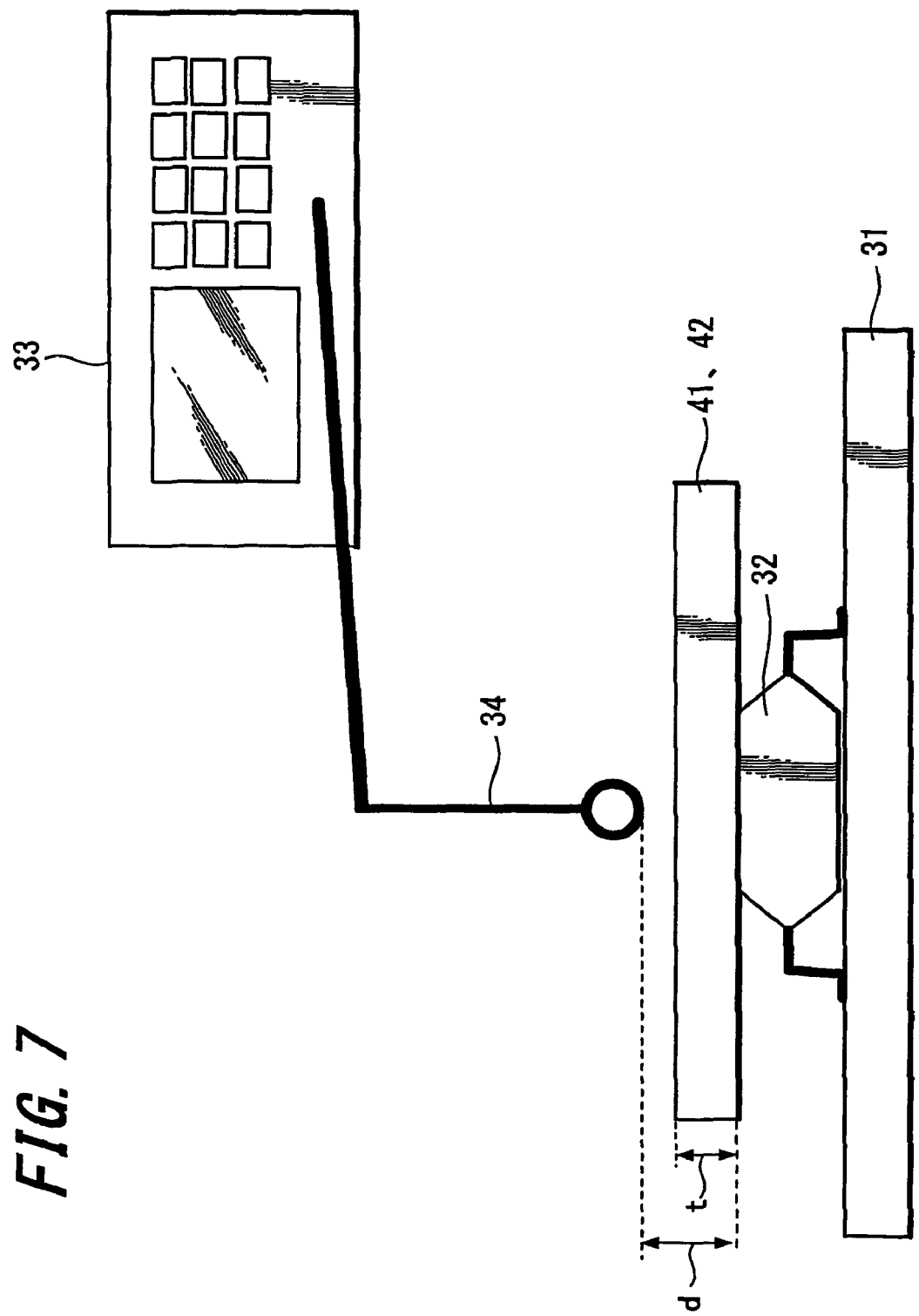

ELECTROMAGNETIC-WAVE SUPPRESSING RADIATOR SHEET AND ELECTRONIC APPARATUS

CROSS REFERENCES TO RELATED APPLICATIONS

The present invention contains subject matter related to Japanese Patent Application JP 2008-004967 filed in the Japanese Patent Office on Jan. 11, 2008, the entire contents of which being incorporated herein by reference.

BACKGROUND OF THE INVENTION

1. Field of the Invention

The present invention relates to an electromagnetic-wave suppressing radiator sheet efficiently transmitting heat from a heating element such as a LSI package to radiator parts such as a radiator plate, a heat pipe, or a heat sink and suppressing electromagnetic waves from coupling with each other. The present invention also relates to an electronic apparatus using such an electromagnetic-wave suppressing radiator sheet.

2. Description of the Related Art

In recent years, electronic apparatuses have been small-sized. Since electric energy (the amount of heat generated) may not be changed much due to the diversity of application, it is important to take measures for heat radiation in the apparatuses.

Radiator plates, heat pipes, heat sinks, and so on made of metal materials with high heat conductivities, such as cupper and aluminum, have been widely used as measures for heat radiation (or measures against heat) in electronic apparatuses.

The arrangement of such a radiator part with excellent heat conductivity for a heat-producing part (high-temperature place) in the electronic apparatus or the arrangement thereof for the area extending from the heat-generating part (high-temperature place) to a low-temperature place can lead to improve a radiation efficiency or temperature relaxation in the apparatus.

However, the radiator part with excellent heat conductivity is made of a metal material, so that it will work as an antenna for high-harmonic noise components or as a communication channel for high-harmonic noise components.

Therefore, the radiator part may also gather the high-harmonic component of an electric signal as a disadvantageous effect. As a result, it often causes the radiation of unnecessary electromagnetic waves.

In addition, a heat-producing part (high-temperature place) in the electronic apparatus mainly includes a chip (semiconductor package) or the like with high current density. In other words, the higher the current density becomes, the higher the electric intensity or magnetic intensity which may serve as a component of the radiation of unnecessary electromagnetic waves increases.

On the other hand, it may be difficult to contact the radiator part with a large surface area of the chip due to their respective dimensions and surface conditions. In such a case, the efficiency of heat radiation may be reduced due to a decrease in contact area or generation of a space between the radiator part and the chip.

Accordingly, the space between the chip (semiconductor package) and the metal radiator such as a heat sink may be filled with a high-temperature conductive filler (heat conductive sheet).

For example, the high-temperature conductive filler with excellent thermal conductive and filling properties can be prepared by allowing a polymer material to contain a material with high heat conductivity, such as alumina or aluminum nitride as a filer.

However, even the use of such a high-temperature conductive filler may not suppress the radiator part picking up the high-harmonic components of electric signals.

As schematically illustrated in FIG. 1, if a high-temperature conductive filler (heat-radiating filler sheet) 53 is placed between a chip 51 and a radiator part (radiator plate) 52, a large amount of heat conduction 62 occurs from the chip 51 to the radiator plate 52 through the heat-radiating filler sheet 53.

In addition, a magnetic field 61 caused by the chip 51 is coupled with the radiator plate 52 to allow a signal 63 with frequency components to be conducted in the radiator plate 52, causing the radiation of unnecessary electromagnetic waves 64.

In order to prevent the coupling of the magnetic field, a space filler (electromagnetic-wave suppressing radiator sheet) prepared by mixing the space filler with a magnetic material may be used. The electromagnetic-wave suppressing radiator sheet may contain a material with high heat conductivity, such as alumina or aluminum nitride, as a filler and a high-permeability material such as ferrite in a silicon- or acryl-based polymer. Accordingly, the electromagnetic-wave suppressing radiator sheet can be provided with a combination of excellent high heat conductivity and an effect of suppressing electromagnetic waves (effect of decoupling a magnetic field).

As schematically illustrated in FIG. 2, when an electromagnetic-wave suppressing radiator sheet 54 is placed between the chip 51 and the radiator part (radiator plate) 52, the electromagnetic-wave suppressing radiator sheet 54 can suppress the coupling of the magnetic field 61 caused by the chip 51 with the radiator plate 52. It leads to a decrease in the signals 63 with frequency components generated in the radiator plate 52, thereby reducing the radiation of unnecessary electromagnetic waves 64.

However, the contents of material powder with excellent heat conductivity may be reduced by combining a radiator sheet with a magnetic material, resulting in a decrease in heat conductivity of an electromagnetic-wave suppressing radiator sheet.

Therefore, the arrangement shown in FIG. 2 leads to a decrease in the heat conduction 62 from the chip 51 to the radiator plate 52 through the electromagnetic-wave suppressing radiator sheet 54 and also causes a decrease in the heat conduction 62 in the radiator plate 52.

Flexibility may also be required for the heat-radiating filler sheet and the electromagnetic-wave suppressing radiator sheet to implement these sheets easily and reduce the thermal resistance caused by the contact between such sheets and the heating element and the radiator part. Therefore, the contents of radiator powder or magnetic powder in the sheet are limited.

In order to suppress a decrease in heat conductivity as small as possible, magnetic particles with excellent magnetic properties may be used to reduce the volume of the magnetic material in the sheet to the absolute minimum.

Ferrite powder, which is metal oxide, is mainly used as magnetic powder in the electromagnetic-wave suppressing radiator sheet to obtain insulation properties.

Metal magnetic materials have excellent magnetic properties. However, metal powder may be exposed on the surface of the sheet when mixing such magnetic material in the sheet. The use of such a material in the electronic apparatus may cause an electric short circuit.

Ferrite powder mixed in the electromagnetic-wave suppressing radiator sheet may be in a size of micrometers.

The micrometer-size ferrite powder is mainly prepared by pulverizing the bulk of sintered ferrite obtained by the solid reaction method. Therefore, the resulting ferrite powder will deteriorate in magnetic properties, compared with the bulk of sintered ferrite, because of crystal distortion in the ferrite particles during the pulverizing.

As described above, the bulk of sintered ferrite has the magnetic properties higher than that of ferrite powder with a size of micrometers. Thus, a stacked structure in which a ferrite plate is placed in a radiator sheet has been proposed (see, for example, Japanese Unexamined Patent Application Publication No. 2001-15656). With such a structure, the ferrite plate obtains a comparatively high effect of suppressing electromagnetic waves while securing somewhat high conductivity by lowering the volume ratio of the magnetic material.

SUMMARY OF THE INVENTION

As described above, flexibility may be required for the electromagnetic-wave suppressing radiator sheet to implement the sheet easily and reduce the thermal resistance caused by the contact with the heating element and the radiator part.

However, the ferrite plate is much harder than resin, so that the structure described in Japanese Unexamined Patent Application Publication No. 2001-15656 using one ferrite plate may be insufficient in flexibility.

It is desirable to provide a highly reliable radiator sheet for suppressing electromagnetic waves, where the sheet has high heat conductivity and an effect of suppressing electromagnetic waves while having flexibility. In addition, it is desirable to provide an electronic apparatus using such a radiator sheet.

According to an embodiment of the present invention, there is provided an electromagnetic-wave suppressing radiator sheet including a heat conductive sheet and at least one magnetic layer in the heat conductive sheet, where the magnetic layer includes a plurality of plate-shaped magnetic bodies.

According to another embodiment of the present invention, there is provided an electronic apparatus including: an electronic component; a radiator material for releasing heat from the electronic component; and an electromagnetic-wave suppressing radiator sheet according to the above embodiment of the present invention. The electromagnetic-wave suppressing radiator sheet is placed between the electronic component and the radiator material and in contact with the electronic component and the radiator material.

According to the configuration of the electromagnetic-wave suppressing radiator sheet of the above embodiment of the present invention, the heat conductive sheet includes at least one magnetic layer having a plurality of plate-shaped magnetic bodies. The plate-shaped magnetic bodies have excellent magnetic properties, compared with ferrite powder. Thus, a highly advantageous effect of suppressing electromagnetic waves can be sufficiently obtained in the magnetic layer having a plurality of the plate-shaped magnetic bodies.

In addition, since the magnetic layer is formed of a plurality of divided plate-shaped magnetic bodies, the flexibility of the electromagnetic-wave suppressing radiator sheet can be improved in comparison with the magnetic layer formed of a single large-sized plate-shaped magnetic body.

According to the configuration of the electronic apparatus of the above embodiment of the present invention, the apparatus includes: the electronic component; the radiator material for releasing heat from the electronic component; and the electromagnetic-wave suppressing radiator sheet of the above embodiment of the present invention. The electromagnetic-wave suppressing radiator sheet is placed between the electronic component and the radiator material and in contact with the electronic component and the radiator material. Therefore, electromagnetic waves generated from the electronic component can be suppressed. In addition, the heat generated from the electronic component can be sufficiently conducted to the radiator material.

According to the above embodiments of the present invention, it becomes possible to obtain a sufficiently high effect of suppressing electromagnetic waves. In other words, it becomes possible to obtain a high effect of suppressing electromagnetic waves even without an increase in volume fraction of the magnetic body. Therefore, the heat conductivity of the magnetic body can be increased by increasing the volume fraction of a high heat conductive material in the heat conductive sheet.

In addition, the flexibility of the electromagnetic-wave suppressing radiator sheet can be improved in comparison with the formation of a magnetic layer with a single large-sized plate-shaped magnetic body. Therefore, the electromagnetic-wave suppressing radiator sheet can be easily implemented, thereby reducing its thermal contact resistance with the heating element and the radiator part.

According to any of the above embodiments of the present invention, the flexible electromagnetic-wave suppressing radiator sheet with high reliability can be obtained while having high heat conductivity and an effect of suppressing electromagnetic waves.

According to any of the above embodiments of the present invention, furthermore, a highly reliable electronic apparatus can be obtained because the radiation of unnecessary electromagnetic waves can be suppressed with the electromagnetic-wave suppressing radiator sheet.

BRIEF DESCRIPTION OF THE DRAWINGS

FIG. 3A is a perspective view, FIG. 3B is a plan view, and FIG. 3C is a cross-sectional view of the sheet.

FIG. 4A is a perspective view, FIG. 4B is a plan view, and FIG. 4C is a cross-sectional view of the sheet.

FIG. 6A is a view of sample A and FIG. 6B is a view of sample B.

FIG. 7 is a schematic view illustrating the configuration of a system where the experiment is carried out.

DESCRIPTION OF THE PREFERRED EMBODIMENTS

Figure 1:
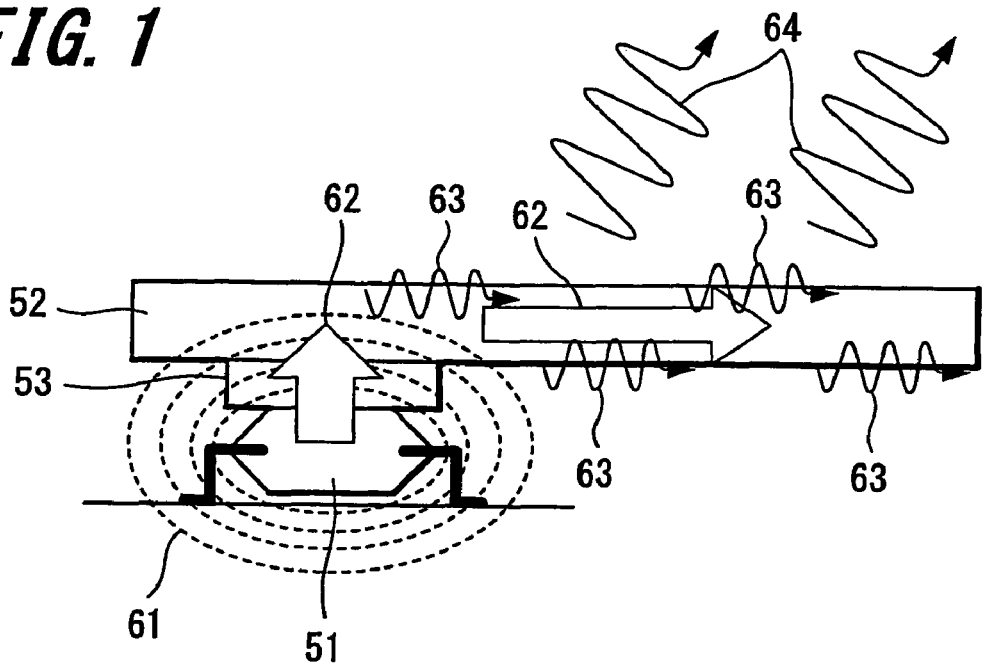
FIG. 1 is a schematic view illustrating a high-temperature conductive filler placed between a chip and a radiator part.
Figure 2:
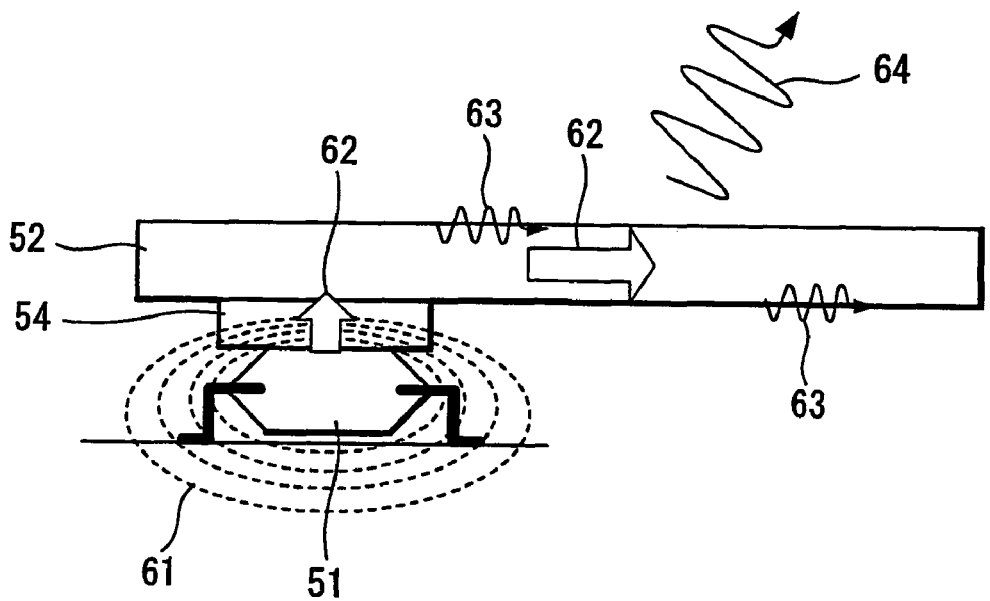
FIG. 2 is a schematic view illustrating an electromagnetic-wave suppressing radiator sheet placed between a chip and a radiator part.

First, embodiments of the present invention will be briefly described in advance of explanation of specific examples thereof.

For suppressing electromagnetic waves while retaining heat conductivity, the inventors of the present application have paid their attention to magnetic properties of magnetic materials and the structure thereof in a sheet. The present inventors have invented a flexible radiator sheet for suppressing electromagnetic waves, which has high heat conductivity and electromagnetic compatibility (EMC).

An electromagnetic-wave suppressing radiator sheet according to an embodiment of the present invention includes a heat conductive sheet and at least one magnetic layer in the heat conductive sheet, where the magnetic layer includes a plurality of plate-shaped magnetic bodies. Therefore, as descried above, such an electromagnetic-wave suppressing radiator sheet can be highly reliable and flexible, having high heat conductivity and an effect of suppressing electromagnetic waves.

The plate-shaped magnetic body may be, for example, a ferrite plate made of sintered ferrite bulk or a magnetic metal plate made of a magnetic metal element or alloy.

The ferrite plate made of the sintered ferrite bulk provides an electromagnetic-wave suppressing radiator sheet with high magnetic properties. Two or more ferrite plates each having a length of 1 mm to 5 mm in the in-plane direction of the magnetic layer and a thickness of 10 µm to 3 mm may be arranged at intervals of 1 µm to 3 mm in a heat-conductive sheet. Therefore, stress from bending to the ferrite can be dispersed and the electromagnetic-wave suppressing radiator sheet can be thus provided with flexibility.

The magnetic metal plate can improve the magnetic properties of the electromagnetic-wave suppressing radiator sheet while allowing the radiator sheet to retain its flexibility.

In addition, the magnetic metal plate (metal) is superior to the ferrite plate (oxide) in terms of heat conductivity. Thus, both the heat conductivity and the magnetic properties can be improved. Two or more magnetic metal plates each having a length of 1 mm to 10 mm in the in-plane direction of the magnetic layer and a thickness of 100 nm to 2 mm are arranged at intervals of 1 µm to 3 mm in a heat-conductive sheet to provide the electromagnetic-wave suppressing radiator sheet with sufficient flexibility.

In addition, the arrangement of the magnetic metal plate in the sheet allows the electromagnetic-wave suppressing radiator sheet to prevent a metal from being exposed on the surface. Thus, the electromagnetic-wave suppressing radiator sheet having excellent heat conductivity and implementing reliability can be provided.

Furthermore, the periphery of the magnetic metal plate may be coated with an insulating material to insulate such a plate more completely.

The heat conductive sheet may contain a heat-radiating filler for increasing heat conductivity in a polymer material. The polymer material may be silicon resin, acryl resin, or the like.

The heat-radiating filler for increasing the heat conductivity of the sheet may be ceramic powder with high heat conductivity, such as alumina, boron nitride, silicon nitride, aluminum nitride, or silicon carbide, and powder of copper, aluminum, or the like coated with an insulating material.

In this case, the filler powder may preferably have a heat conductivity of 10 W/mK or more.

However, the heating-radiating filler used in the embodiment of the present invention is not limited to any of these materials.

The materials which can be used for the ferrite plate include magnetic materials made of iron oxides, such as Mn—Zn ferrite, Ni—Zn ferrite, Cu—Zn ferrite, Cu—Mg—Zn ferrite, Mn—Mg—Al ferrite, YIG ferrite, and Ba ferrite.

However, materials which can be used for the ferrite plate in the embodiment are not limited to these materials.

The materials which can be used for the magnetic metal plate include soft-magnetic metal materials, for example, magnetic metal elements such as Fe, Co, and Ni, and magnetic metal alloys such as FeNi, FeCo, FeAl, FeSi, FeSiAl, FeSiB, and CoSiB.

In the embodiment of the present invention, materials which can be used for the magnetic metal plate are not limited to these materials.

Examples of the insulating material, with which the magnetic plate is covered, include materials made of resin mixed with any of alumina, aluminum nitride, and boron nitride powders. The powder in this case may preferably have a heat conductivity of 10 W/mK or more.

In addition, for example, any material selected from alumina, aluminum nitride, and boron nitride can be used.

Furthermore, for example, any material selected from Mn—Zn ferrite, Ni—Zn ferrite, Cu—Zn ferrite, Cu—Mg—Zn ferrite, Mn—Mg—Al ferrite, YIG ferrite, and Ba ferrite can be used. In other words, it may be any insulating material of iron-based oxide.

The electromagnetic-wave suppressing radiator sheet according to the embodiment of the present invention may not have the random arrangement of magnetic bodies like those in the related art using magnetic filler but have the regular arrangement of magnetic bodies in the horizontal direction. Therefore, the sheet may easily incorporate the magnetic field.

Hereinafter, specific examples according to an embodiment of the present invention will be described.

Figure 3A:
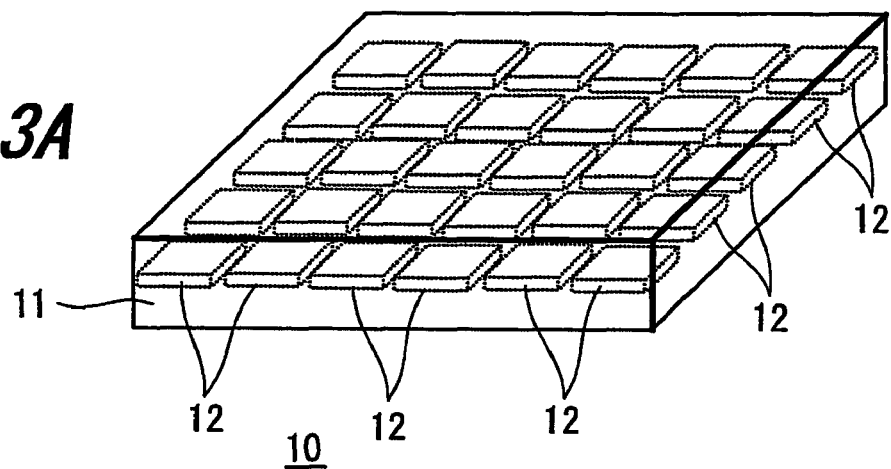
FIGS. 3A to 3C are schematic views illustrating the configuration of an electromagnetic-wave suppressing radiator sheet according to an embodiment of the present invention, where
Figure 3B:
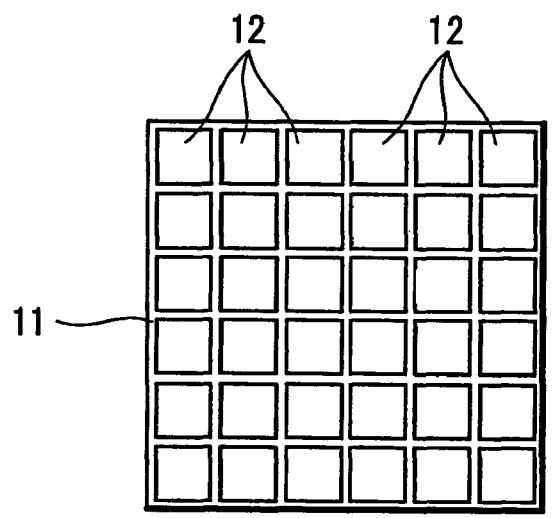
Figure 3C:
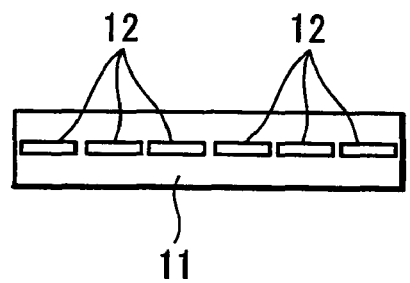

FIGS. 3A to 3C are schematic views illustrating an electromagnetic-wave suppressing radiator sheet 10 according to an embodiment of the present invention, where FIG. 3A is a perspective view of the sheet, FIG. 3B is a plan view of the sheet, and FIG. 3C is a cross-sectional view of the sheet.

The electromagnetic-wave suppressing radiator sheet 10 includes a heat conductive sheet 11 in which a number of plate-shaped small magnetic bodies (hereinafter, referred to as "magnetic plates") 12 are arranged in the horizontal direction of the sheet 11 to form a magnetic layer. The respective magnetic plates 12 have a square shape and are arranged substantially in rows and columns.

The magnetic plate 12 may be a ferrite plate or a magnetic metal plate.

Various kinds of materials can be used as materials of the sheet 11 and the magnetic plate (ferrite plate or magnetic metal plate) 12.

In the above configuration of the electromagnetic-wave suppressing radiator sheet 10 according to the above embodiment, the magnetic layer including a plurality of magnetic plates 12 horizontally arranged therein is placed in the heat conductive sheet 11. A sufficiently high effect of suppressing electromagnetic waves can be obtained with the magnetic layer including a plurality of magnetic plates 12, because the magnetic plate 12 is the bulk of a magnetic material having magnetic properties superior to those of ferrite powder.

In addition, the magnetic layer is formed of the plurality of divided magnetic plates 12, providing the electromagnetic-wave suppressing radiator sheet 10 with flexibility higher than that of a sheet including a magnetic layer formed of a single large-sized magnetic plate.

Furthermore, it becomes possible to obtain a sufficiently-high effect of suppressing electromagnetic waves by placing the magnetic layer in the electromagnetic-wave suppressing radiator sheet 10. In other words, it becomes possible to obtain a high effect of suppressing electromagnetic waves even without a high volume fraction of the magnetic bodies. Accordingly, the volume fraction of the high thermal conductive material in the heat conductive sheet 11 can be increased to obtain a high heat conductivity of the heat conductive sheet 11.

In addition, in comparison with the formation of a magnetic layer with a single large-sized plate-shaped magnetic body, the flexibility of the electromagnetic-wave suppressing radiator sheet 10 can be increased. Therefore, the electromagnetic-wave suppressing radiator sheet 10 can be easily implemented, thereby reducing the thermal contact resistance thereof with the heating element and the radiator part.

Therefore, the configuration of the present embodiment can lead to obtain the flexible electromagnetic-wave suppressing radiator sheet 10 suppressing electromagnetic-waves with high reliability, while having an effect of suppressing electromagnetic waves.

Figure 4A:
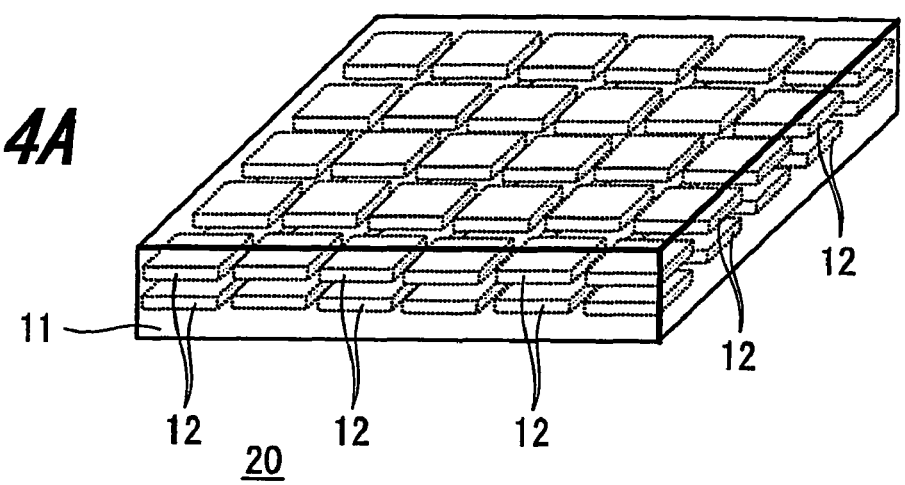
FIGS. 4A to 4C are schematic views illustrating the configuration of an electromagnetic-wave suppressing radiator sheet according to another embodiment of the present invention, where
Figure 4B:
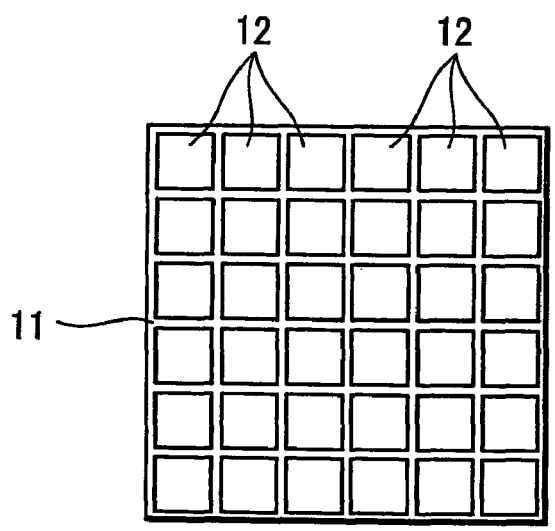
Figure 4C:
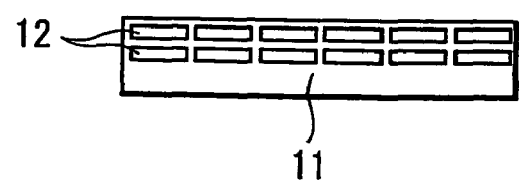

FIGS. 4A to 4C are schematic views illustrating an electromagnetic-wave suppressing radiator sheet 20 according to another embodiment of the present invention. FIG. 4A is a perspective view, FIG. 4B is a plan view, and FIG. 4C is a cross-sectional view thereof.

The electromagnetic-wave suppressing radiator sheet 20 is formed in a manner similar to the aforementioned electromagnetic-wave suppressing radiator sheet 10 shown in FIGS. 3A to 3C except that two magnetic layers are stacked on top of one another through a heat conductive sheet 11. In this embodiment, each magnetic layer includes a plurality of magnetic plates 12 aligned in the horizontal direction.

According to the configuration of the electromagnetic-wave suppressing radiator sheet 20 of the present embodiment, each magnetic layer includes a plurality of magnetic plates 12 aligned in the horizontal direction just as in the case with the electromagnetic-wave suppressing radiator sheet 10 of the aforementioned embodiment. Therefore, the flexible electromagnetic-wave suppressing radiator sheet 20 with high reliability while having high heat conductivity and an effect of suppressing electromagnetic waves can be realized.

In addition, since the electromagnetic-wave suppressing radiator sheet 20 includes two magnetic layers stacked on top of one another, expansion of the magnetic field in the vertical or thickness direction can be suppressed. Thus, the electromagnetic-wave suppressing radiator sheet 20 will suppress electromagnetic waves more efficiently.

Figure 5:
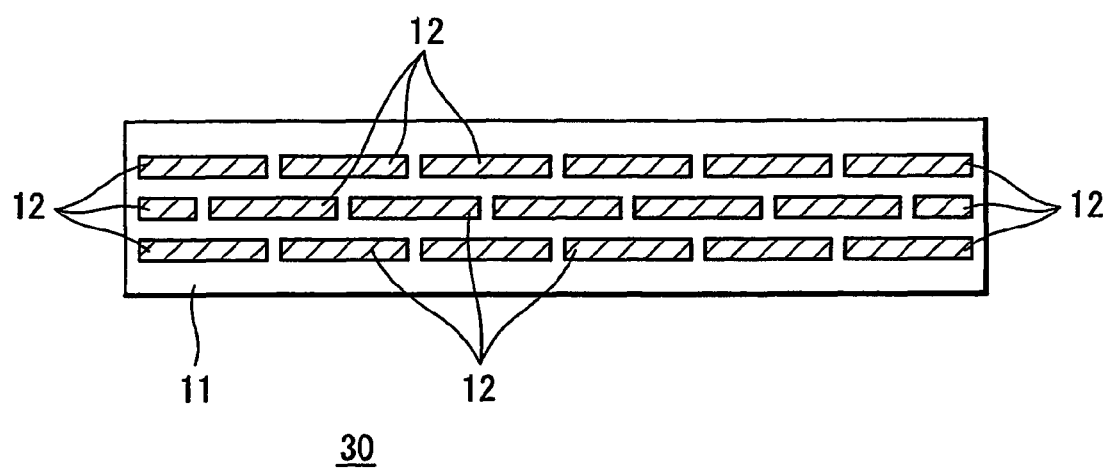
FIG. 5 is a schematic cross-sectional view illustrating an electromagnetic-wave suppressing radiator sheet according to further another embodiment of the present invention.

FIG. 5 is a schematic cross-sectional view illustrating an electromagnetic-wave suppressing radiator sheet 30 according to a further embodiment of the present invention.

An electromagnetic-wave suppressing radiator sheet 30 of the present embodiment as shown in FIG. 5 is formed in a manner similar to that of the electromagnetic-wave suppressing radiator sheet 10 or 20 except that the electromagnetic-wave suppressing radiator sheet 30 includes three magnetic layers. In this embodiment, each magnetic layer includes a plurality of magnetic plates 12 aligned in the horizontal direction and arranged in a staggered configuration in two magnetic layers adjacent in the vertical direction (thickness direction).

According to the configuration of the electromagnetic-wave suppressing radiator sheet 30 of the present embodiment, each magnetic layer includes a plurality of magnetic plates 12 aligned in the horizontal direction just as in the case with the electromagnetic-wave suppressing radiator sheets 10 and 20 of the aforementioned embodiments. Therefore, the flexible electromagnetic-wave suppressing radiator sheet 30 with high reliability can be obtained while having high heat conductivity and an effect of suppressing electromagnetic waves.

Furthermore, the magnetic plates 12 are arranged in a staggered configuration in two magnetic layers adjacent in the vertical direction (thickness direction). Therefore, non-magnetic materials between the magnetic plates 12 are not continuously arranged in the vertical direction. Thus, a leakage of electric field in the vertical direction of the electromagnetic-wave suppressing radiator sheet 30 can be further reduced.

As described above, the cross sectional view in one direction of the electromagnetic-wave suppressing radiator sheet 30 is illustrated in FIG. 5 and the adjacent magnetic plates 12 are arranged in a staggered configuration in two magnetic layers adjacent in the vertical direction (thickness direction). Preferably, the magnetic plates 12 are arranged in a staggered configuration also in the direction vertical to the cross-section shown in the figure, thereby reducing the leakage of a magnetic field in the vertical direction of the electromagnetic-wave suppressing radiator sheet 30.

In the embodiment illustrated in FIG. 5, the magnetic plates 12 are arranged in a staggered configuration in adjacent magnetic layers in the vertical direction. Alternatively, the magnetic plates 12 in the adjacent magnetic layers may be arranged differently, or the positions thereof are shifted from one another such that gaps between the magnetic plates 12 in the adjacent magnetic layers are discontinuous in the vertical direction. In this case also, there is an effect of suppressing a leakage of magnetic field in the vertical direction of the electromagnetic-wave suppressing radiator sheet 30.

The arrangement of the magnetic plates 12 in a staggered configuration in two magnetic layers in the vertical direction according to the present embodiment can be applied to an electromagnetic-wave suppressing radiator sheet having two or more magnetic layers.

The electromagnetic-wave suppressing radiator sheet illustrated in each of the above embodiments may be manufactured as described below.

A first manufacturing method includes preparing small magnetic plates in advance and horizontally arranging the small magnetic plates in each magnetic layer when a sheet is manufactured.

A second manufacturing method includes placing one large-sized magnetic plate on a radiator sheet and then cutting the magnetic plate into a plurality of small-sized magnetic plates by etching with excimer laser.

Furthermore, if two or more magnetic layers are present in the second manufacturing method, the cutting of the magnetic plate in the upper magnetic layer into pieces may be carefully carried out to keep the lower magnetic plate intact. Thus, the arrangement of the magnetic plates in a staggered configuration can be attained as illustrated in FIG. 5.

The electromagnetic-wave suppressing radiator sheet of any of the above embodiments of the invention can be used in the manufacture of an electronic apparatus such that the electromagnetic-wave suppressing radiator sheet is placed between a heating element such as a LSI package and a radiator part such as a heat sink.

The electronic apparatus using the electromagnetic-wave suppressing radiator sheet of any of the above embodiments of the invention has a suitable heat-radiating property. Even if the driving frequency of the heating element is high and a large amount of heat is released, the apparatus can be stably operated and obtain high reliability.

In addition, the electromagnetic-wave suppressing radiator sheet can suppress the electromagnetic waves generated from the heating element. Thus, the radiation of unnecessary electromagnetic waves can be significantly reduced.

In an example of the above embodiments of the present invention, the magnetic plates used may be both ferrite plates and magnetic metal plates in combination. For example, one of the magnetic layers may include ferrite plates and another one may include magnetic metal plates. In addition, for example, ferrite plates and magnetic metal plates may be used in combination in the same magnetic layer.

The gap between the magnetic plates is preferably narrow to reduce the leakage of the magnetic field as small as possible.

In addition, the gap between the magnetic plates may preferably be filled with the heat conductive sheet material to enhance heat conductivity, instead of leaving the gap as it is.

Furthermore, the magnetic plate may not be in the shape of a square. Alternatively, it may be in the shape of a rectangle, a circle, a triangle, a hexagon, or the like.

In particular, the magnetic plates may be designed to cover all over the flat surface. Examples of the form include triangles such as an equilateral triangle, an isosceles triangle, and a rectangular triangle, a square, a rectangle, and a hexagon. With the magnetic plates designed to cover all over the flat surface, the gap between the magnetic plates can be reduced. Therefore, the leakage of the magnetic field can be reduced.

For obtaining EMC, in addition to the electromagnetic-wave suppressing radiator sheet of any embodiment of the present invention, various electromagnetic-wave suppressing materials may be used. The use of the electromagnetic-wave suppressing radiator sheet of any embodiment of the present invention will lead to a decrease in number of other electromagnetic-wave suppressing materials or enhance an effect of suppressing electromagnetic waves as a whole in combination with the other electromagnetic-wave suppressing materials. Furthermore, even if the driving frequency of IC increases, it becomes possible to suppress electromagnetic waves.

Experiment

Here, the electromagnetic-wave suppressing radiator sheet of an embodiment of the present invention was actually prepared and subjected to the following experiment to verify an effect of suppressing electromagnetic waves of the embodiment of the present invention.

Figure 6A:
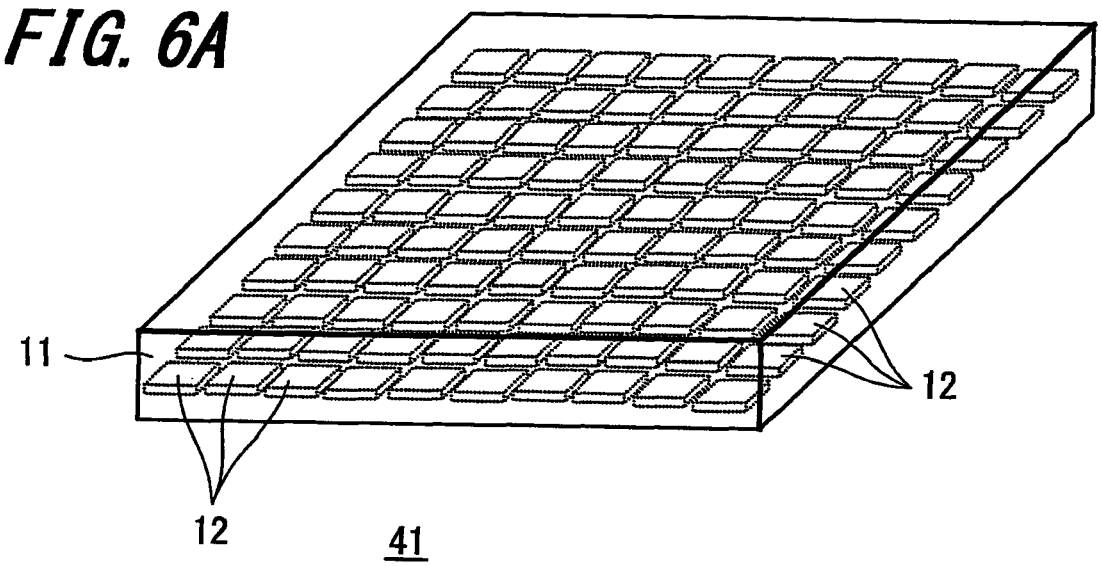
FIGS. 6A and 6B are schematic perspective views illustrating electromagnetic-wave suppressing radiator sheets as samples used in an experiment, where
Figure 6B:
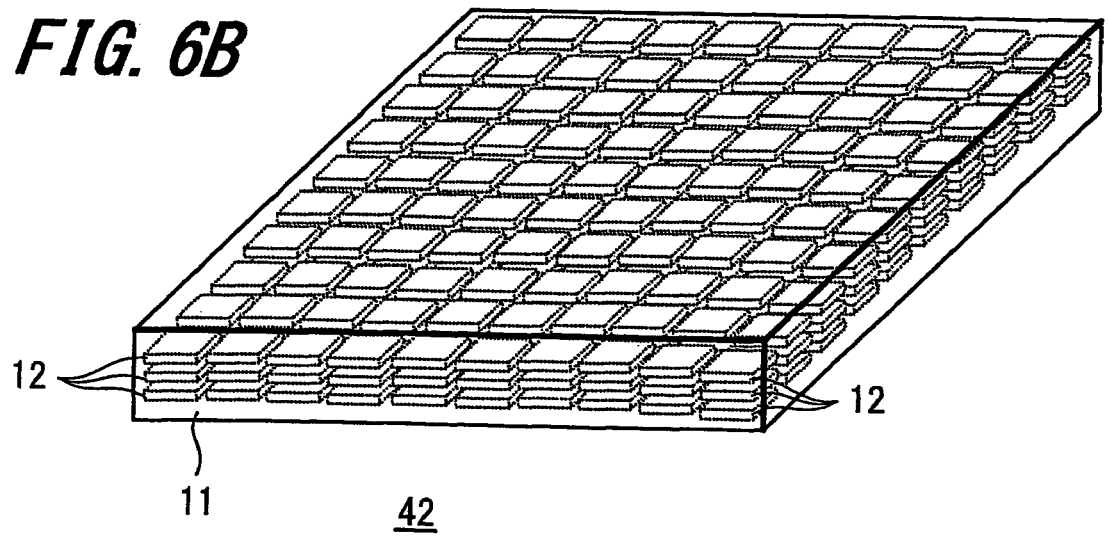

FIGS. 6A and 6B are schematic perspective views illustrating samples of two different electromagnetic-wave suppressing radiator sheets used in the experiment, respectively.

A first sample 41 of the electromagnetic-wave suppressing radiator sheet is illustrated in FIG. 6A. A second sample 42 of the electromagnetic-wave suppressing radiator sheet is illustrated in FIG. 6B. Each of these samples is in the form of a square plate with outside dimensions of 25 mm in length, 25 mm in width, and 2.0 mm in thickness.

Furthermore, any sample uses a sheet containing alumina particles as a heat conductive sheet 11 and ferrite plates as magnetic plates 12 constituting the magnetic layer. In the first sample 41, only a single magnetic layer is provided. In the second sample 42, three magnetic layers are stacked on top of one another.

Each of the ferrite plates used was Ni—Zn ferrite in the form of a square plate with dimensions of 2.0 mm in length, 2.0 mm in width, and 0.2 mm in thickness.

The ferrite plates were arranged in a 10- by 10-plate matrix in a plane of the sheet with intervals of 0.5 mm. The distance between the outermost ferrite plate 12 and the periphery of the heat conductive sheet 11 is 0.25 mm.

The magnetic layer formed of ferrite plates 12 may be arranged so as to be placed at the center of the heat conductive sheet 11 in the thickness direction. In the first sample 41, the distance between the ferrite plate 12 and the upper or bottom surface of the sheet is 0.9 mm. In the second sample 42, the distance between two magnetic layers is 0.3 mm. The distance between the ferrite plate 12 of the uppermost or undermost magnetic layer and the upper or bottom surface of the sheet is 0.4 mm.

FIG. 7 schematically illustrates the configuration of a system used in the experiment.

In this system, a LSI package 32 bonded on a substrate 31 was provided as a noise source. For measuring the intensity of the magnetic field from the LSI package 32, a loop-shaped magnetic-field prove 34 is connected to a spectrum analyzer 33. The distance d between the upper surface of the LSI package 32 and the magnetic-field prove 34 was kept at a constant distance of 3 mm. The magnetic intensity in the presence or absence of the sample 41 or 42 was evaluated. The thickness t of the sample 41 or 42 was 2 mm as described above and the distance between the upper surface of the sample 41 or 42 and the magnetic-field prove 42 was 1 mm.

The driving frequency of the LSI package 32 used was 33 MHz.

The volume fraction of ferrite in each of the samples 41 and 42 used in the present experiment was measured. In the first sample (one-layer) 41, the volume fraction of ferrite was 6.4%. In the second sample (three-layer) 42, the volume fraction of ferrite was 19.2%.

Using the apparatus shown in FIG. 7, the magnetic intensity of each sample was measured. The frequency was varied from 50 MHz to 1000 MHz to determine the magnetic intensity at the respective frequencies.

For comparison, furthermore, the samples 41 and 42 were removed from the system shown in FIG. 7 and the magnetic intensity was then determined in the absence of any sample.

Figure 8:
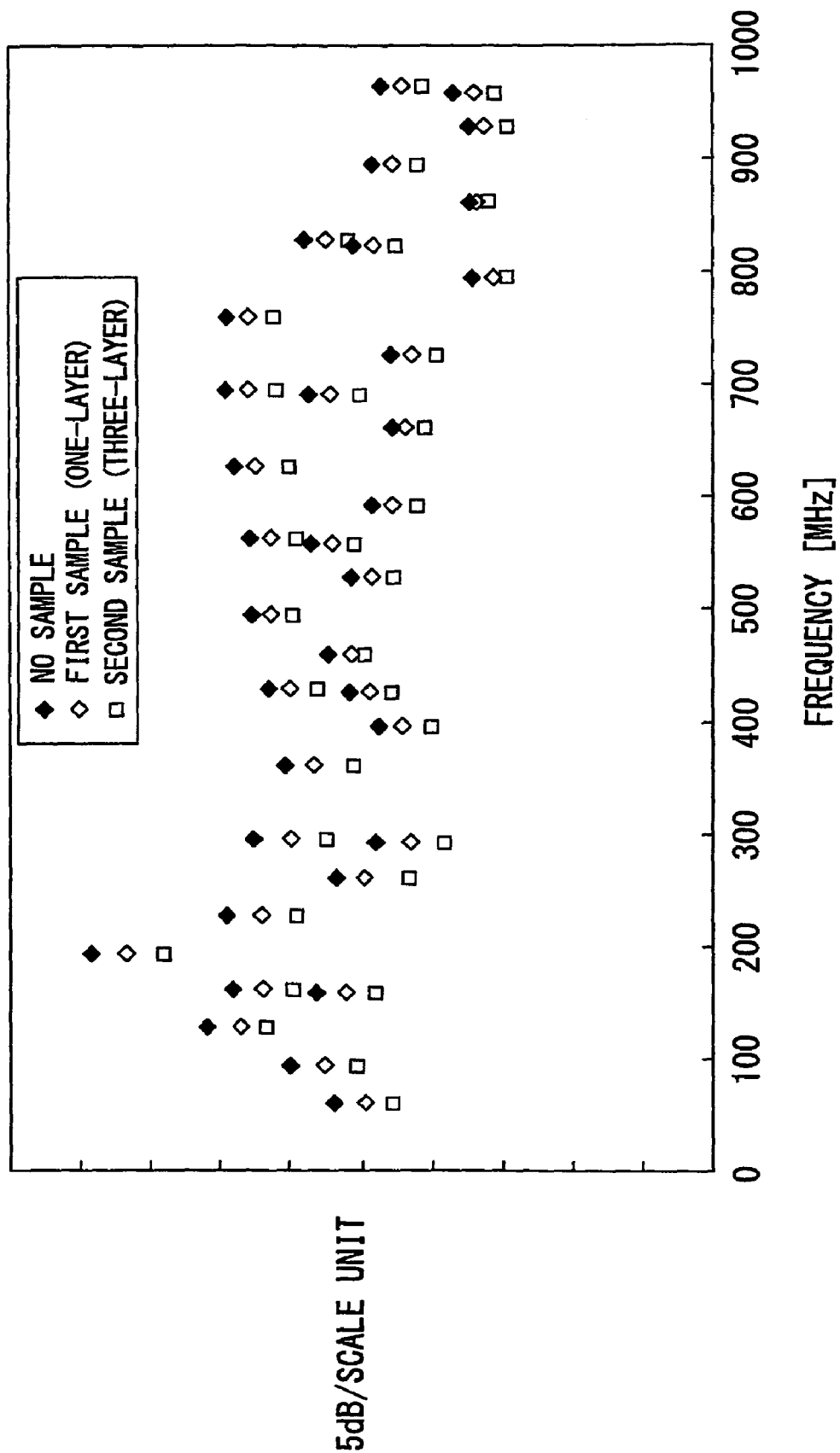
FIG. 8 is a graphical representation of the relationship between frequency and magnetic intensity.

The results of the measurement were plotted on FIG. 8 to represent the relationship between the frequency and the magnetic intensity. In the figure, "no sample" indicates the intensity of the magnetic field from the LSI package 32 in the absence of any sample. In the vertical axis of FIG. 8, the relative magnetic intensity is plotted every 5 dB (5 dB per scale unit).

As shown in FIG. 8, as compared with the measurement in the absence of any sample, the first sample (one-layer) 41 with a ferrite volume fraction of 6.4% showed an effect of suppressing the magnetic field of about 2 dB to 3 dB.

The second sample (three-layer) 42 with a ferrite volume fraction of 19.2% showed an effect of suppressing the magnetic field of about 3 dB to 5 dB.

Among them, the results of the second sample (three-layer) 42 showed the same effect of suppressing the magnetic field as that of the commercially-available electromagnetic-wave suppressing radiator sheet in which ferrite particles (about 40% of ferrite volume fraction) and alumina particles were dispersed.

Furthermore, the flexibilities of the respective samples 41 and 42 were sufficient to be used.

From the above results, if the electromagnetic-wave suppressing radiator sheet of any embodiment of the present invention is designed to have the same ferrite volume fraction as that of the commercially-available one, a higher effect of suppressing the magnetic field can be obtained.

Furthermore, the ferrite volume fraction of the sheet of any embodiment of the present invention can be smaller than that of the commercially-available one if the same effect of suppressing the magnetic field as that of the commercially-available one is intended to be obtained. Therefore, the contents of alumina particles (high heat-conductive particles) may be increased as much as a decrease in ferrite volume. Thus, still higher heat conductivity can be obtained.

From the above results, according to the configuration of the electromagnetic-wave suppressing radiator sheet of any of the above embodiments, a high-performance electromagnetic-wave suppressing radiator sheet with excellent flexibility can be obtained without impairing the magnetic properties of ferrite.

Furthermore, comparing with ferrite, the magnetic metal is excellent in magnetic property and in heat conductivity. Therefore, the magnetic metal plates can be used as the magnetic plates to provide a high-performance electromagnetic-wave suppressing radiator sheet.

Preferably, the electromagnetic-wave suppressing radiator sheet of any embodiment of the present invention is arranged between an electronic component, such as an integrated circuit (LSI), with a large amount of heat generated therefrom and a radiator material for radiating heat of the electronic component, while contacting with the electronic component and the radiator material.

Hereinafter, an electronic apparatus according to an embodiment of the present invention will be described. The electric apparatus includes an electromagnetic-wave suppressing radiator sheet of an embodiment of the present invention arranged as described above for the electronic component.

Figure 9:
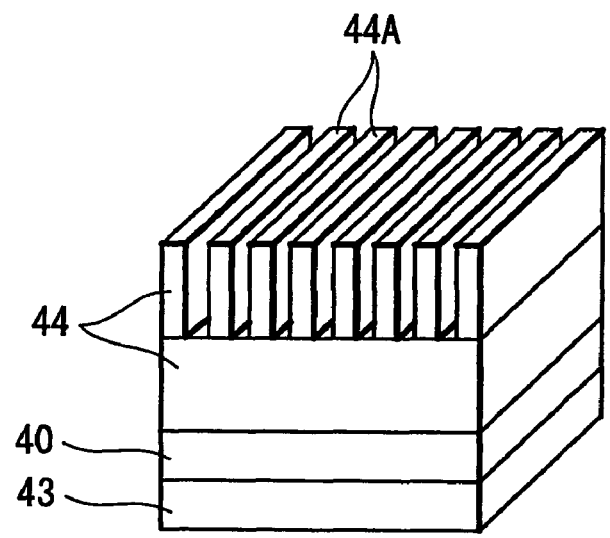
FIG. 9 is a schematic perspective view illustrating main parts of an electronic apparatus according to an embodiment of the present invention.

FIG. 9 is a perspective view illustrating main parts of the electronic component of an electronic apparatus according to an embodiment of the present invention.

As illustrated in FIG. 9, an electromagnetic-wave suppressing radiator sheet 40 is placed between a LSI package 43, an electronic component with a large amount of heat generated therefrom, and a heat sink 44, a radiator material, while contacting with the LSI package 43 and the heat sink 44.

A fin 44A for heat radiation is mounted on the top of the heat sink 44.

An electromagnetic-wave suppressing radiator sheet according to any of the embodiments of the present invention as described above will be used as the electromagnetic-wave suppressing radiator sheet 40.

According to the embodiment of the present invention, in the configuration of the electronic apparatus shown in FIG. 9, the electromagnetic-wave suppressing radiator sheet 40 is placed between the LSI package 43 and the heat sink 44 while contacting with the LSI package 43 and the heat sink 44. Therefore, the electromagnetic-wave suppressing radiator sheet 40 can suppress the electromagnetic waves generated from the LSI package 43 and the generation of unnecessary electromagnetic waves radiated. In addition, heat generated from the LSI package 43 can be sufficiently conducted to the heat sink 44 through the electromagnetic-wave suppressing radiator sheet 40.

Figure 10:
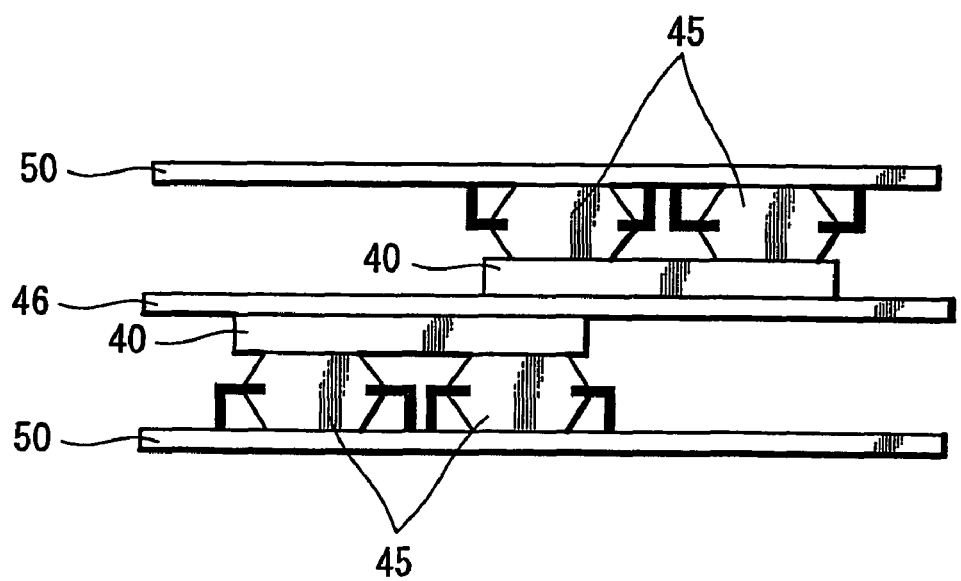
FIG. 10 is a side view illustrating main parts of an electronic apparatus according to another embodiment of the present invention.

Next, FIG. 10 is a side view showing main parts of an electronic apparatus according to another embodiment of the present invention.

The apparatus includes two circuit boards 50 and each of them is connected to an LSI package 45 that is an electronic component with a large amount of heat generated therefrom.

In addition, the LSI packages 45 of the respective circuit boards 50 share a radiator plate 46 made of a radiator material.

The electromagnetic-wave suppressing radiator sheet 40 is placed between the radiator plate 46 and respective LSI packages 45 on two circuit boards 50 so that it can be brought into contact with both the LSI package 45 and the radiator plate 46.

The electromagnetic-wave suppressing radiator sheet according to any of the embodiments of the present invention described above will be used as the electromagnetic-wave suppressing radiator sheet 40.

According to the configuration of the electronic apparatus of the present embodiment as shown in FIG. 10, the electromagnetic-wave suppressing radiator sheet 40 is placed between the LSI package 45 and the radiator plate 46 so that it can be brought into contact with both the LSI package 45 and the radiator plate 46. Therefore, the electromagnetic waves generated from the LSI packages 45 can be suppressed and the radiation of unnecessary electromagnetic waves can be thus suppressed. In addition, heat generated from the LSI packages 45 can be sufficiently conducted to the radiator plate 46 through the electromagnetic-wave suppressing radiator sheets 40, respectively.

The present invention should not be construed to be limited to the aforementioned embodiments. The present invention may be embodied in various other forms as far as within the gist of the present invention.

It should be understood by those skilled in the art that various modifications, combinations, sub-combinations and alterations may occur depending on design requirements and other factors insofar as they are within the scope of the appended claims or the equivalents thereof.

What is claimed is:

1. An electromagnetic-wave suppressing radiator sheet comprising:
    magnetic plates from the group consisting of ferrite plates and magnetic metal plates;
    a heat conductive sheet made of a resin mixed with a powder, said powder being a material from the group consisting of alumina, aluminum nitride, boron nitride, and an insulator-coated powder,
    wherein a first layer of the magnetic plates is between a first level of the heat conductive sheet and a second level of the heat conductive sheet, a first interior portion of the heat conductive sheet isolating one of the magnetic plates in the first layer from another of the magnetic plates in the first layer.

2. The electromagnetic-wave suppressing radiator sheet according to claim 1, wherein said powder has a heat conductivity of 10 W/mK or more.

3. The electromagnetic-wave suppressing radiator sheet according to claim 1, wherein said insulator-coated powder is a powder of copper coated with an insulating material.

4. The electromagnetic-wave suppressing radiator sheet according to claim 1, wherein said insulator-coated powder is a powder of aluminum coated with an insulating material.

5. The electromagnetic-wave suppressing radiator sheet according to claim 1, wherein said magnetic plates are arranged at intervals of 1 μm to 3 mm in the in-plane direction of the first layer.

6. The electromagnetic-wave suppressing radiator sheet according to claim 1, wherein a second layer of the magnetic plates is between said second level of the heat conductive sheet and an inner level of the heat conductive sheet.

7. The electromagnetic-wave suppressing radiator sheet according to claim 6, wherein a second interior portion of the heat conductive sheet isolates one of the magnetic plates in the second layer from another of the magnetic plates in the second layer.

8. The electromagnetic-wave suppressing radiator sheet according to claim 6, wherein said first layer of the magnetic plates is between said first layer of the heat conductive sheet and said inner level of the heat conductive sheet.

9. The electromagnetic-wave suppressing radiator sheet according to claim 6, wherein a third layer of the magnetic plates is between said first layer of the magnetic plates and said second layer of the magnetic plates.

10. The electromagnetic-wave suppressing radiator sheet according to claim 9, wherein a third interior portion of the heat conductive sheet isolates one of the magnetic plates in the third layer from another of the magnetic plates in the third layer.

11. The electromagnetic-wave suppressing radiator sheet according to claim 9, wherein the magnetic plates in the third layer are staggered from the magnetic plates in the first and second layer.

12. The electromagnetic-wave suppressing radiator sheet according to claim 1, wherein said magnetic plates are ferrite plates.

13. The electromagnetic-wave suppressing radiator sheet according to claim 12, wherein each of the ferrite plates has a thickness of 10 μM to 3 mm and a length of 1 mm to 5 mm, said thickness and length being in the in-plane direction of the first layer.

14. The electromagnetic-wave suppressing radiator sheet according to claim 12, wherein each of the ferrite plates is made of a material from the group consisting of Mn—Zn ferrite, Ni—Zn ferrite, Cu—Zn ferrite, Cu—Mg—Zn ferrite, Mn—Mg—Al ferrite, YIG ferrite, and Ba ferrite.

15. The electromagnetic-wave suppressing radiator sheet according to claim 1, wherein said magnetic plates are magnetic metal plates.

16. The electromagnetic-wave suppressing radiator sheet according to claim 15, wherein each of the magnetic metal plates has a thickness of 100 nm to 2 mm and a length of 1 mm to 10 mm, said thickness and length being in the in-plane direction of the first layer.

17. The electromagnetic-wave suppressing radiator sheet according to claim 15, wherein each of the magnetic metal plates is made of a material from the group consisting of Fe, Co, Ni, FeNi, FeCo, FeAl, FeSi, FeSiAl, FeSiB, and CoSiB.

18. The electromagnetic-wave suppressing radiator sheet according to claim 15, wherein an insulating material covers said magnetic metal plates.

19. The electromagnetic-wave suppressing radiator sheet according to claim 18, wherein said insulating material is a material from the group consisting of alumina, aluminum nitride, and boron nitride.

20. The electromagnetic-wave suppressing radiator sheet according to claim 18, wherein said insulating material is a material from the group consisting of Mn—Zn ferrite, Ni—Zn ferrite, Cu—Zn ferrite, Cu—Mg—Zn ferrite, Mn—Mg—Al ferrite, YIG ferrite, and Ba ferrite.

21. The electromagnetic-wave suppressing radiator sheet according to claim 1, wherein said radiator sheet is between an electronic component and a radiator material, said radiator material being configure to release heat from said electronic component.

* * * * *